United States Patent
Hsiao et al.

(10) Patent No.: US 10,817,416 B2
(45) Date of Patent: Oct. 27, 2020

(54) MEMORY MANAGEMENT METHOD AND STORAGE CONTROLLER

(71) Applicant: Shenzhen EpoStar Electronics Limited CO., Shenzhen (CN)

(72) Inventors: Yu-Hua Hsiao, Hsinchu County (TW); Hung-Chih Hsieh, Hsinchu County (TW); Tzu-Wei Fang, Taipei (TW)

(73) Assignee: Shenzhen EpoStar Electronics Limited CO., Shenzhen (CN)

( * ) Notice: Subject to any disclaimer, the term of this patent is extended or adjusted under 35 U.S.C. 154(b) by 0 days.

(21) Appl. No.: 16/036,955

(22) Filed: Jul. 17, 2018

(65) Prior Publication Data

US 2019/0347192 A1   Nov. 14, 2019

(30) Foreign Application Priority Data

May 14, 2018   (TW) .............................. 107116302 A

(51) Int. Cl.
*G06F 12/02* (2006.01)
*G06F 3/06* (2006.01)
*G11C 11/56* (2006.01)
*G11C 16/10* (2006.01)

(52) U.S. Cl.
CPC .......... *G06F 12/0246* (2013.01); *G06F 3/064* (2013.01); *G06F 3/0679* (2013.01); *G11C 11/5628* (2013.01); *G11C 16/105* (2013.01); *G06F 2212/2022* (2013.01); *G06F 2212/7201* (2013.01)

(58) Field of Classification Search
CPC .................................................. G06F 12/0246
See application file for complete search history.

(56) References Cited

U.S. PATENT DOCUMENTS

2017/0242789 A1*   8/2017   Ahmed ............... G06F 12/0246
2019/0196966 A1*   6/2019   Hwang .................. G06F 12/10

* cited by examiner

Primary Examiner — Edward J Dudek, Jr.
(74) Attorney, Agent, or Firm — JCIPRNET

(57) ABSTRACT

A Memory management method for a storage device having a rewritable non-volatile memory module is provided. The rewritable non-volatile memory module has a plurality of physical blocks divided into a plurality of block stripes. The method includes: scanning the physical blocks to identify one or more bad physical blocks among the physical blocks; calculating a plurality of effective weight values corresponding to the block stripes according to a plurality of data accessing time parameters of the rewritable non-volatile memory module, a plurality of valid data counts, and the identified one or more bad physical blocks; and selecting a target block stripe from the block stripes according to the effective weight values to perform a garbage collection operation.

12 Claims, 4 Drawing Sheets

MEMORY MANAGEMENT METHOD AND STORAGE CONTROLLER

CROSS-REFERENCE TO RELATED APPLICATION

This application claims the priority benefit of Taiwan application serial no. 107116302, filed on May 14, 2018. The entirety of the above-mentioned patent application is hereby incorporated by reference herein and made a part of this specification.

BACKGROUND

Technical Field

The invention relates to a memory management method, and more particularly, to a memory management method and a storage controller adapted to a storage device having a rewritable non-volatile memory module.

Description of Related Art

In general, when the free space of the rewritable non-volatile memory module is insufficient, a controller of the rewritable non-volatile memory module would perform a garbage collection operation on a block stripe of the rewritable non-volatile memory module to release an available space of the block stripe.

However, in the case where the rewritable non-volatile memory module has a bad physical block, the available space released by the block stripe having the bad physical block through the garbage collection operation would be less than the available space released by the block stripe not having the bad physical block.

Accordingly, how to select an appropriate block stripe to perform the garbage collection operation with the existence of bad physical block taken into consideration, thereby improving efficiency of the garbage collection operation and increasing a released space is one of research topics for persons skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention provides a memory management method and a storage controller adapted to a storage device having a rewritable non-volatile memory module, which can select a block stripe to perform the garbage collection operation with the existence of bad physical block taken into consideration, so as to increase effects of the garbage collection operation.

An embodiment of the invention provides a memory management method, adapted to a storage device having a rewritable non-volatile memory module. The rewritable non-volatile memory module has a plurality of physical blocks. The physical blocks are divided into a plurality of block stripes, and the block stripes are arranged according to a first sequence. The method includes: scanning the physical blocks to identify one or more bad physical blocks among the physical blocks; identifying a plurality of valid data counts corresponding to the block stripes; calculating a plurality of effective weight values corresponding to the block stripes according to a plurality of data accessing time parameters of the rewritable non-volatile memory module, a plurality of valid data counts, and a location of the identified one or more bad physical blocks; and selecting a target effective weight value from the effective weight values, and performing a garbage collection operation on a target block stripe corresponding to the target effective weight value among the block stripes.

An embodiment of the invention provides a storage controller, which is configured to control a storage device having a rewritable non-volatile memory module. The storage controller includes a connection interface circuit, a memory interface control circuit, a block stripe management circuit unit and a processor. The connection interface circuit is configured to couple to a host system. The memory interface control circuit is configured to couple to the rewritable non-volatile memory module. The rewritable non-volatile memory module has a plurality of physical blocks. The physical blocks are divided into a plurality of block stripes, and the block stripes are arranged according to a first sequence. The block stripe management circuit unit is configured to scan the physical blocks to identify one or more bad physical blocks among the physical blocks. The block stripe management circuit unit is further configured to identify a plurality of valid data counts corresponding to the block stripes. The block stripe management circuit unit is further configured to calculate a plurality of effective weight values corresponding to the block stripes according to a plurality of data accessing time parameters of the rewritable non-volatile memory module, the valid data counts, and a location of the identified one or more bad physical blocks. The block stripe management circuit unit is further configured to select a target effective weight value from the effective weight values, and perform a garbage collection operation on a target block stripe corresponding to the target effective weight value among the block stripes.

Based on the above, the memory management method and the storage controller provided by the embodiments of the invention can be used to scan and identify the bad physical blocks, calculate the effective weight values corresponding to the block stripes according to the data accessing time parameters of the rewritable non-volatile memory module, the valid data counts, and the location of the identified one or more bad physical blocks, and select the target block stripe among the block stripes according to the effective weight values to perform the garbage collection operation. As a result, the more appropriate block stripe that can release more space may be selected with the bad physical block taken into consideration to improve efficiency of the garbage collection operation.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
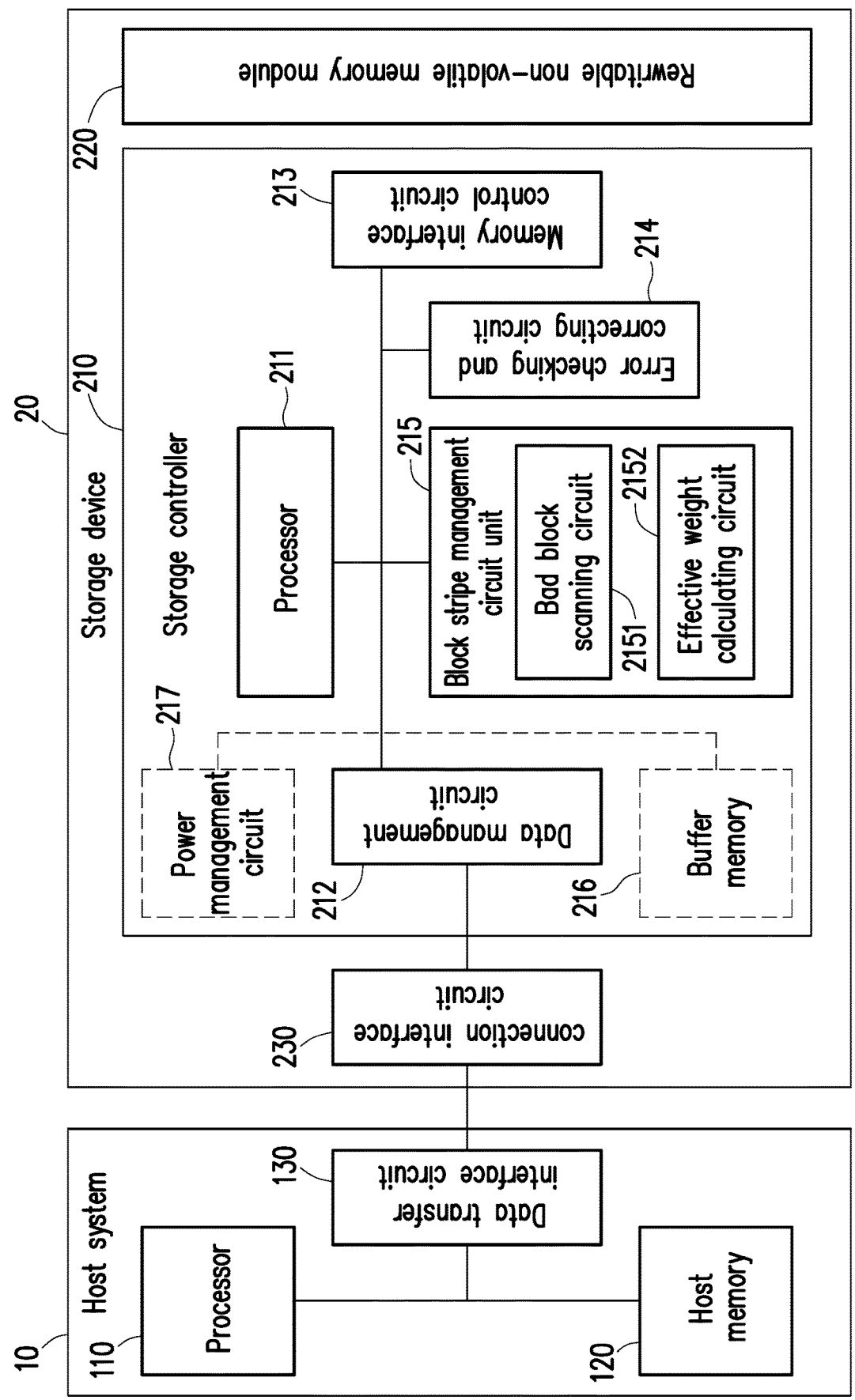
FIG. 1 is a block diagram illustrating a host system and a storage device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In the present embodiment, a storage device includes a rewritable non-volatile memory module and a storage device controller (a.k.a. a storage controller or a storage control circuit). Also, the storage device is usually used together with a host system so the host system can write data into or read data from the storage device.

FIG. 1 is a block diagram illustrating a host system and a storage device according to an embodiment of the invention.

With reference to FIG. 1, a host system 10 includes a processor 110, a host memory 120 and a data transfer interface circuit 130. In this embodiment, the data transfer interface circuit 130 is coupled to (or, electrically connected to) the processor 110 and the host memory 120. In another embodiment, the processor 110, the host memory 120 and the data transfer interface circuit 130 are coupled to one another by utilizing a system bus.

A storage device 20 includes a storage controller 210, a rewritable non-volatile memory module 220 and a connection interface circuit 230. Among them, the storage controller 210 includes a processor 211, a data management circuit 212 and a memory interface control circuit 213.

In this embodiment, the host system 10 is coupled to the storage device 20 through the data transfer interface circuit 130 and the connection interface circuit 230 of the storage device 20 to perform a data accessing operation. For example, the host system 10 can store data to the storage device 20 or read data from the storage device 20 through the data transfer interface circuit 130.

In the present embodiment, the processor 110, the host memory 120 and the data transfer interface circuit 130 may be disposed on a main board of the host system 10. The number of the data transfer interface circuit 130 may be one or more. Through the data transfer interface circuit 130, the main board may be coupled to the storage device 20 in a wired manner or a wireless manner. The storage device 20 may be, for example, a flash drive, a memory card, a solid state drive (SSD) or a wireless memory storage device. The wireless memory storage device may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board may also be coupled to various I/O devices including a GPS (Global Positioning System) module, a network interface card, a wireless transmission device, a keyboard, a monitor and a speaker through the system bus.

In this embodiment, the data transfer interface circuit 130 and the connection interface circuit 230 are an interface circuit compatible with a Peripheral Component Interconnect Express (PCI Express) interface standard. Further, a data transfer is performed between the data transfer interface circuit 130 and the connection interface circuit 230 by using a communication protocol of a Non-Volatile Memory express (NVMe) interface standard.

Nevertheless, it should be understood that the invention is not limited to the above. The data transfer interface circuit 130 and the connection interface circuit 230 may also be compatible to a PATA (Parallel Advanced Technology Attachment) standard, an IEEE (Institute of Electrical and Electronic Engineers) 1394 standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC interface standard, a UFS (Universal Flash Storage) interface standard, an eMCP interface standard, a CF interface standard, an IDE (Integrated Device Electronics) interface standard or other suitable standards. Further, in another embodiment, the connection interface circuit 230 and the storage controller 210 may be packaged into one chip, or the connection interface circuit 230 is distributed outside a chip containing the storage controller 210.

In this embodiment, the host memory 120 is configured to temporarily store commands executed by the processor 110 or data. For instance, in this exemplary embodiment, the host memory 120 may be a DRAM (Dynamic Random Access Memory), or a SRAM (Static Random Access Memory) and the like. Nevertheless, it should be understood that the invention is not limited in this regard, and the host memory 120 may also be other appropriate memories.

The storage unit 210 is configured to execute a plurality of logic gates or control commands, which are implemented in a hardware form or in a firmware form, and to perform operations of writing, reading or erasing data in the rewritable non-volatile memory storage module 220 according to the commands of the host system 10.

More specifically, the processor 211 in the storage controller 210 is a hardware with computing capabilities, which is configured to control overall operation of the storage controller 210. Specifically, the processor 211 has a plurality of control commands and the control commands are executed to perform various operations such as writing, reading and erasing data during operation of the storage device 20.

It should be noted that, in the present embodiment, the processor 110 and the processor 211 are, for example, a central processing unit (CPU), a micro-processor, other programmable microprocessors, a digital signal processor (DSP), a programmable controller, an application specific integrated circuits (ASIC), a programmable logic device (PLD) or other similar circuit elements. The invention is not limited in this regard.

In an embodiment, the storage controller 210 further includes a ROM (not illustrated) and a RAM (not illustrated). More particularly, the ROM has a boot code, which is executed by the processor 221 to load the control commands stored in the rewritable non-volatile memory module 220 into the RAM of the storage controller 210 when the storage controller 210 is enabled. Then, the control commands are executed by the processor 211 to perform operations, such as writing, reading or erasing data. In another embodiment, the control commands of the processor 211 may also be stored as program codes in a specific area (for example, physical storage units in the rewritable non-volatile memory module 220 dedicated for storing system data) of the rewritable non-volatile memory module 220.

In this embodiment, as described above, the storage controller 210 further includes the data management circuit 212 and the memory interface control circuit 213. It should be noted that, operations performed by each part of the storage controller 210 may also be considered as operations performed by the storage controller 210.

The data management circuit 212 is coupled to the processor 211, the memory interface control circuit 213 and the connection interface circuit 230. The data management circuit 212 is configured to transmit data under instruction of the processor 211. For example, the data may be read from the host system 10 (e.g., the host memory 120) through the connection interface circuit 230, and the read data may be written into the rewritable non-volatile memory module 220 through the memory interface control circuit 213 (e.g., a writing operation performed according to the write command from the host system 10). As another example, the data may be read from one or more physical units of the rewritable non-volatile memory module 220 through the memory interface control circuit 213 (the data may be read from one or more memory cells in one or more physical units), and the read data may be written into the host system 10 (e.g., the host memory 120) through the connection interface circuit 230 (e.g., a reading operation performed according to a read command from the host system 10). In another embodiment, the data management circuit 212 may also be integrated into the processor 211.

The memory interface control circuit 213 is configured to perform the writing (or, programming) operation, the reading operation and the erasing operation for the rewritable non-volatile memory module 220 together with the data management circuit 212 under instruction of the processor 211.

For instance, the processor 211 may execute a write command sequence to instruct the memory interface control circuit 213 to write the data into the rewritable non-volatile memory module 220; the processor 211 can execute a read command sequence to instruct the memory interface control circuit 213 to read the data from one or more physical units corresponding to the read command in the rewritable non-volatile memory module 220; the processor 211 can execute an erase command sequence to instruct the memory interface control circuit 213 to perform the erasing operation for the rewritable non-volatile memory module 220. Each of the write command sequence, the read command sequence and the erase command sequence may include one or more program codes or command codes, which are configured to perform the corresponding writing, reading and erasing operations on the rewritable non-volatile memory module 220. In an embodiment, the memory interface control circuit 213 may further perform corresponding operations (e.g., a bad block scanning operation, a wear leveling operation, a garbage collection operation) on the rewritable non-volatile memory module 220 according to other received command sequences. The command sequences may include one or more signals, or data from the bus. The signals or the data may include command codes and program codes. For example, information such as identification codes and memory addresses are included in the read command sequence; Information such as a logical address to be written, write data, a writing mode to be used (e.g., a single-plane writing mode or a multi-plane writing mode) and the like are included in the write command sequence.

In addition, data to be written to the rewritable non-volatile memory module 220 is converted into a format acceptable by the rewritable non-volatile memory module 220 through the memory interface control circuit 213.

The rewritable non-volatile memory module 220 is coupled to the storage controller 210 (the memory control circuit unit 213) and configured to store data written from the host system 10. The rewritable non-volatile memory module 220 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a QLC (Quadruple Level Cell) NAND flash memory module (i.e., a flash memory module capable of storing four bits in one memory cell), a 3D NAND flash memory module or a vertical NAND flash memory module, a vertical NAND flash memory module or a vertical NAND flash memory module other flash memory modules or any memory module having the same features. The memory cells in the rewritable non-volatile memory module 220 are disposed in an array.

In this embodiment, the rewritable non-volatile memory module 220 has a plurality of word lines, wherein each word line among the word lines includes a plurality of memory cells. The memory cells on the same word line constitute one or more physical programming units (physical pages). In addition, a plurality of physical programming units may constitute one physical unit (a physical block or a physical erasing unit). In this embodiment, the TLC (Triple Level Cell) NAND flash memory is taken as an example. That is to say, in the following embodiment, one memory cell capable of storing three bit values is used as one physical programming unit (i.e., in each programming operation, the data is programmed by applying a programming voltage one by one on the physical programming units). Here, each memory cell may be grouped into a lower physical page, a middle physical page and an upper physical page.

In this embodiment, the memory cell is used as a minimum unit for writing (programming) data. The physical unit is a minimum unit for erasing (i.e., each physical unit includes a minimum number of memory cells to be erased together). Each physical unit includes multiple memory cells.

In the following embodiments, examples in which one physical block serves as one physical unit are provided. However, in another embodiment, one physical unit may also refer to a combination of any number of memory cells, depending on practical requirements. Further, it should be understood that, when the processor 211 groups the memory cells (or the physical units/the physical blocks) in the rewritable non-volatile memory module 220 for the corresponding management operations, the memory cells (or the physical units) are logically grouped and their actual locations are not changed.

The storage controller 210 assigns a plurality of logical units for the rewritable non-volatile memory module 220. The host system 10 accesses user data stored in a plurality of physical units through the assigned logical units. Here, each of the logical units may be composed of one or more logical addresses. For example, the logical unit may be a logical block, a logical page, or a logical sector. Each logical unit may be mapped to one or more physical units, wherein the physical unit may be one or more physical addresses, one or more physical sectors, one or more physical programming units, or one or more physical erasing units. In the present embodiment, the logical unit is a logical block, and the logical sub-unit is a logical page. Each logical unit includes a plurality of logical sub-units.

For instance, the storage controller 210 would create a logical to physical address mapping table and a physical to logical address mapping table for recording a mapping relation between the logical units (e.g., the logical blocks, the logical pages or the logical sectors) assigned to the rewritable non-volatile memory module 220 and the physical units (e.g., the physical erasing units, the physical programming units or the physical sectors). In other words, the storage controller 210 can look up for the physical unit mapped to one logical unit by using the logical to physical address mapping table, and the storage controller 210 can look up for the logical unit mapped to one physical unit by using the physical to logical address mapping table. Nonetheless, the technical concept for the mapping relation between the logical units and the physical units is a well-known technical means in the field, which is not repeated hereinafter.

In this embodiment, the error checking and correcting circuit 214 is coupled to the processor 211 and configured to execute an error checking and correcting procedure to ensure correctness of data. Specifically, when the processor 211 receives the write command from the host system 10, the error checking and correcting circuit 214 generates an ECC (error correcting code) and/or an EDC (error detecting code) for data corresponding to the write command, and the processor 211 writes data corresponding to the write command and the corresponding ECC and/or the EDC into the rewritable non-volatile memory module 220. Then, when the processor 211 reads the data from the rewritable non-volatile memory module 220, the ECC and/or the EDC corresponding to the data are also read, and the error checking and correcting circuit 214 performs the error checking and correcting procedure on the read data based on the ECC and/or the EDC. In addition, after the error checking and correcting procedure is completed, if the read data is successfully decoded, the error checking and correcting circuit 214 can return an error bit value to the processor 211.

In an embodiment, the storage controller 210 further includes a buffer memory 216 and a power management circuit 217. The buffer memory is coupled to the processor 211 and configured to temporarily store data and commands from the host system 10, data from the rewritable non-volatile memory module 220 or other system data for managing the storage device 20 so the processor 211 can rapidly access the data, the command or the system data from the buffer memory 216. The power management circuit 217 is coupled to the processor 211 and configured to control power of the storage device 20.

In this embodiment, the block stripe management circuit unit 215 includes a bad block scanning circuit 2151 and an effective weight calculating circuit 2152. The block stripe management circuit unit 215 is configured to calculate an effective weight value for each block stripe according to identified bad physical block(s) so the processor 211 can select a target block stripe according to all the effective weight values from all block stripes to perform the garbage collection operation. It should be noted that, operations performed by each part of the block stripe management circuit unit 215 may also be considered as operations performed by the block stripe management circuit unit 215.

Details regarding the method of "selecting/determining the block stripe (a.k.a. the target block stripe) to perform the garbage collection operation" and the memory management method, the storage controller and the block stripe management circuit unit 215 provided by this embodiment are described below with reference to FIG. 2, FIG. 3 and FIG. 4.

Figure 2:
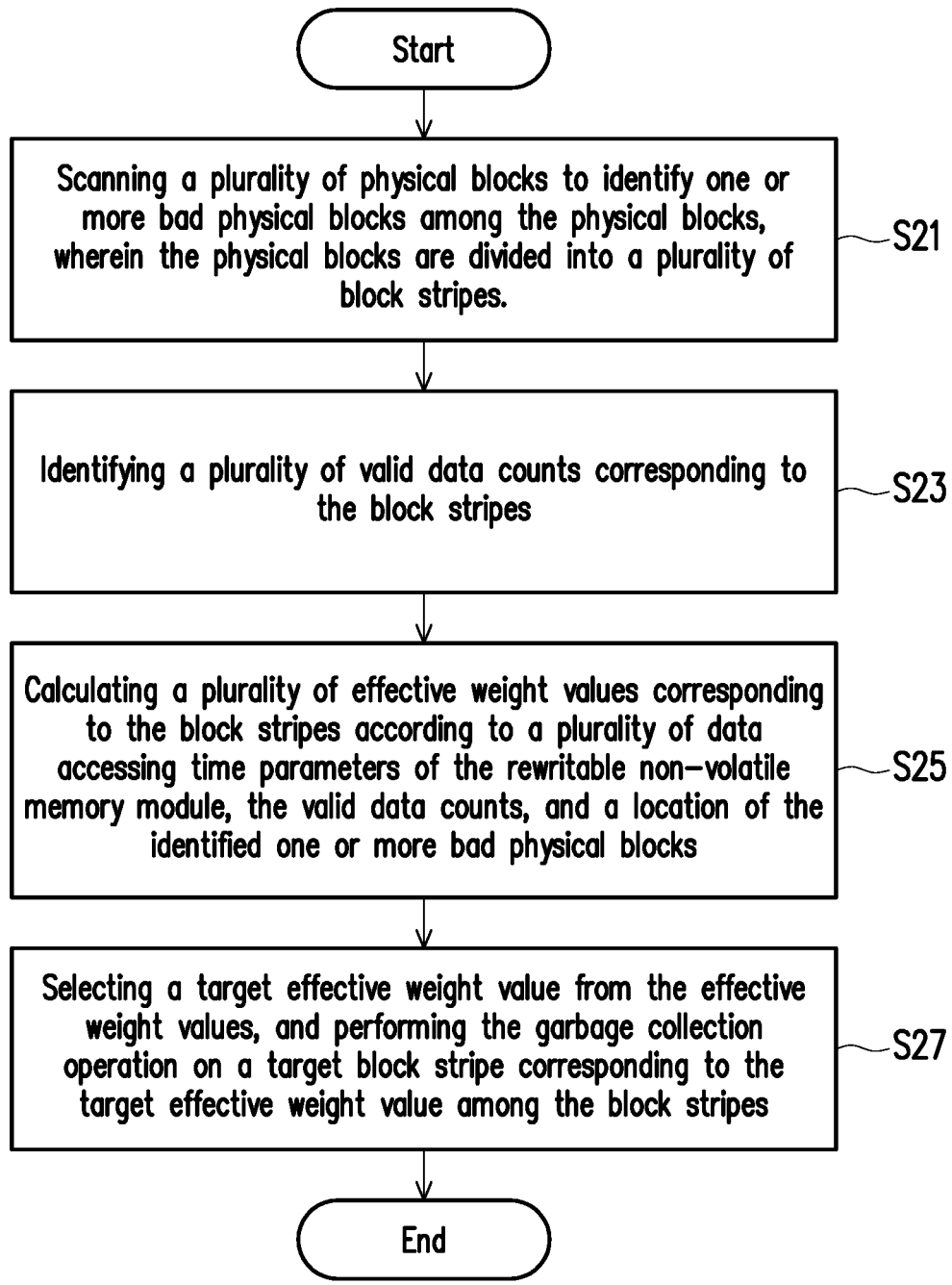
FIG. 2 is a flowchart illustrating a memory management method according to an embodiment of the invention.

FIG. 2 is a flowchart illustrating a memory management method according to an embodiment of the invention. It should be noted that, the memory management method illustrated in FIG. 2 may also be referred to as a garbage collection block stripe selection method. Referring to FIG. 1 and FIG. 2 together, in step S21, the block stripe management circuit unit 215 scans a plurality of physical blocks to identify one or more bad physical blocks among the physical blocks. Here, the physical blocks are divided into a plurality of block stripes. Specifically, in this embodiment, the processor 211 can instruct the bad block scanning circuit 2151 in the block stripe management circuit unit 215 to perform a bad physical block scanning operation at one of the following timing points: (1) when the storage device 20 is idle (i.e., when the storage device 20 is idle for more than a predetermined time threshold); (2) when the storage device is powered on; (3) when an error bit count of data read from one physical block exceeds an error bit count threshold. The bad physical block scanning operation is to scan all or specific one (e.g., the physical block corresponding to the condition (3) above) of the physical block. In addition, the bad block scanning circuit 2151 can identify the physical address (or the identification code) and a total of the physical block determined as the bad physical block. In another embodiment, according to one or a combination of the statistics and the error bit count of all the physical blocks, the processor 211 can select the physical block with poor physical condition (e.g., the physical block with higher erase count or higher error bit count) as the physical block to be scanned. In an embodiment, the processor 211 may also randomly select the target physical block to perform the bad physical block scanning operation. Details regarding the bad physical block scanning operation are the technical means conventionally used in the field, which are omitted herein. In other words, after performing the bad physical block scanning operation, the processor 211 or the bad block scanning circuit 2151 can know if each block stripe has the bad physical block. If one block stripe has one or more bad physical blocks, the processor 211 or the bad block scanning circuit 2151 would also know a location and a total of said one or more bad physical blocks of said one block stripe.

Apart from that, in another embodiment, based on a specific event that occurred during operation of the storage device 20, the processor 211 may also instantly determine that the physical block corresponding to the specific event is the bad physical block.

In this embodiment, the processor 211 or the block stripe management circuit unit 215 may record the location and the total of the identified bad physical blocks by using a table (e.g., a bad physical block table or a block stripe management table). The concept of the block stripe is described below with reference to FIG. 3.

Figure 3:
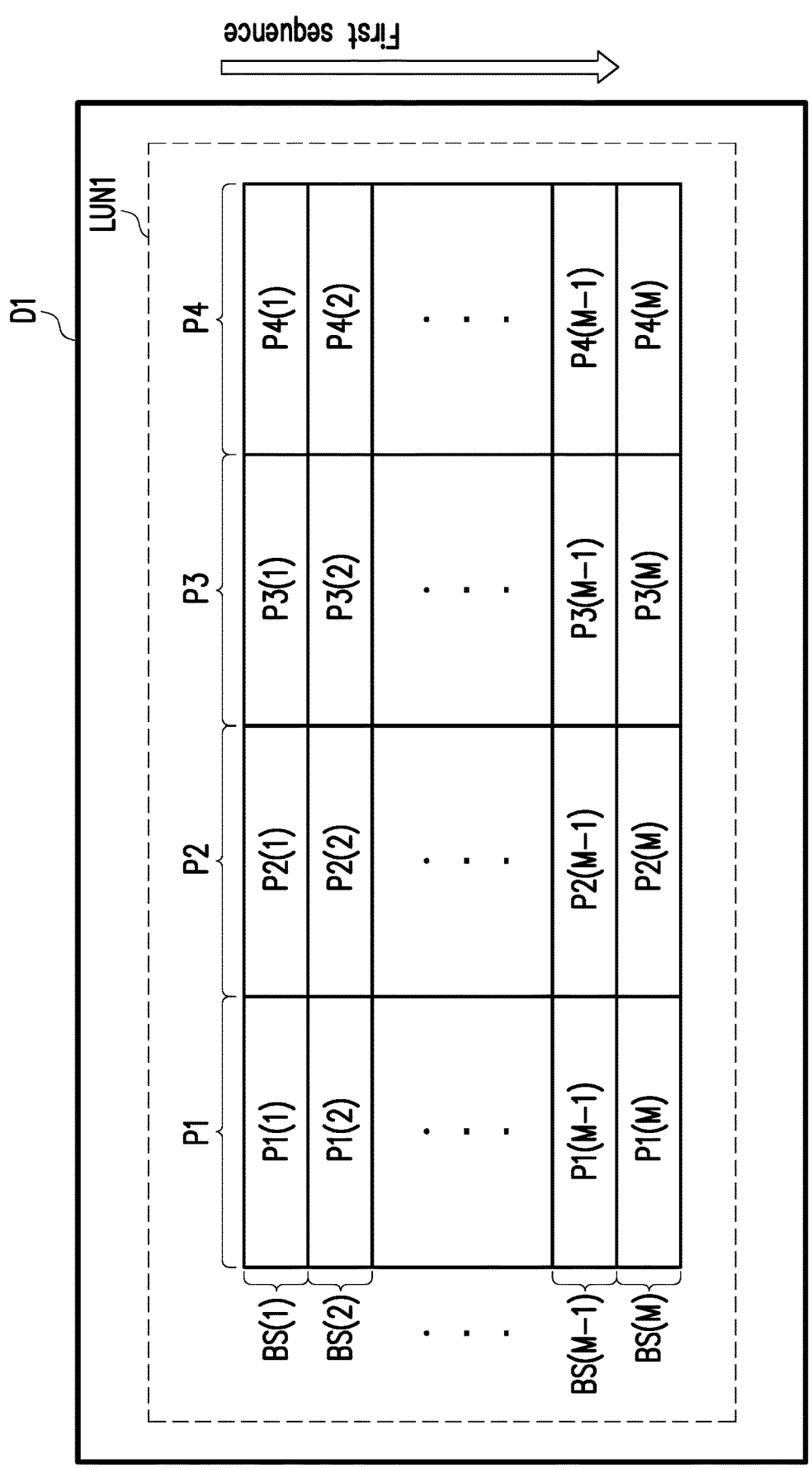
FIG. 3 is a schematic diagram illustrating a plurality of block stripes of the rewritable non-volatile memory module according to an embodiment of the invention.

FIG. 3 is a schematic diagram illustrating a plurality of block stripes of the rewritable non-volatile memory module according to an embodiment of the invention. With reference to FIG. 3, specifically, the rewritable non-volatile memory module 220 may include a plurality of packages. Each of the packages may include a plurality of physical blocks, and the physical blocks may be divided into N planes. Also, a part or all of the planes may be logically grouped into one logical unit number (LUN). To simplify the description, it is assumed that the rewritable non-volatile memory module 220 has one package D1, and the package D1 has a plurality of physical blocks. The physical blocks are divided (grouped) into four planes P1 to P4 (N is equal to 4), and said four planes are grouped into one logical unit number LUN1. Further, each plane has M physical units arranged according to a first sequence. For example, the plane P1 has M physical blocks P1(1) to P1(M); the plane P2 has M physical blocks P2(1) to P2(M); the plane P2 has M physical blocks P3(1) to P3(M); the plane P4 has M physical blocks P4(1) to P4(M). In this embodiment, the physical blocks arranged at the same order from each of the planes are grouped into one block stripe. For example, a block stripe BS(1) includes the physical block P1(1), the physical block P2(1), the physical block P3(1) and the physical block P4(1). In other words, all the physical blocks in said four planes may be grouped into M block stripes BS(1) to BS(M) arranged according to the first sequence.

In this embodiment, the garbage collection operation performed by the storage controller 210 is performed with one block stripe as a unit. More specifically, when the processor 211 intends to perform the garbage collection operation, the processor 211 would first select/determine the block stripe (a.k.a. the target block stripe) from all the block stripes BS(1) to BS(M) to perform the garbage collection operation. Next, the processor 211 identifies a location (the physical address) of valid data of the target block stripe and a location (the physical address) of the bad physical block, copies all the valid data to the other physical blocks, and performs the erasing operation on normal physical blocks (the physical blocks which are not the bad physical block) of the target block stripe. Details about "identifying the location (the physical address) of the valid data of the target block stripe and the location (the physical address) of the bad physical block, copying all the valid data to the other physical blocks, and performing the erasing operation on the normal physical blocks (the physical blocks which are not the bad physical block) of the target block stripe" as a part of the garbage collection operation is a well-known technical means in the field, which is not omitted herein. However, it should be noted that, the spirit of the invention lies in how to improve the method of selecting/determining target block string appropriately in order to reduce the negative impact of the bad physical blocks. That is to say, the invention aims to improve the method for the operation of "selecting/determining the target block stripe from all the block stripes BS(1) to BS(M) to perform the garbage collection operation" described above.

Figure 4:
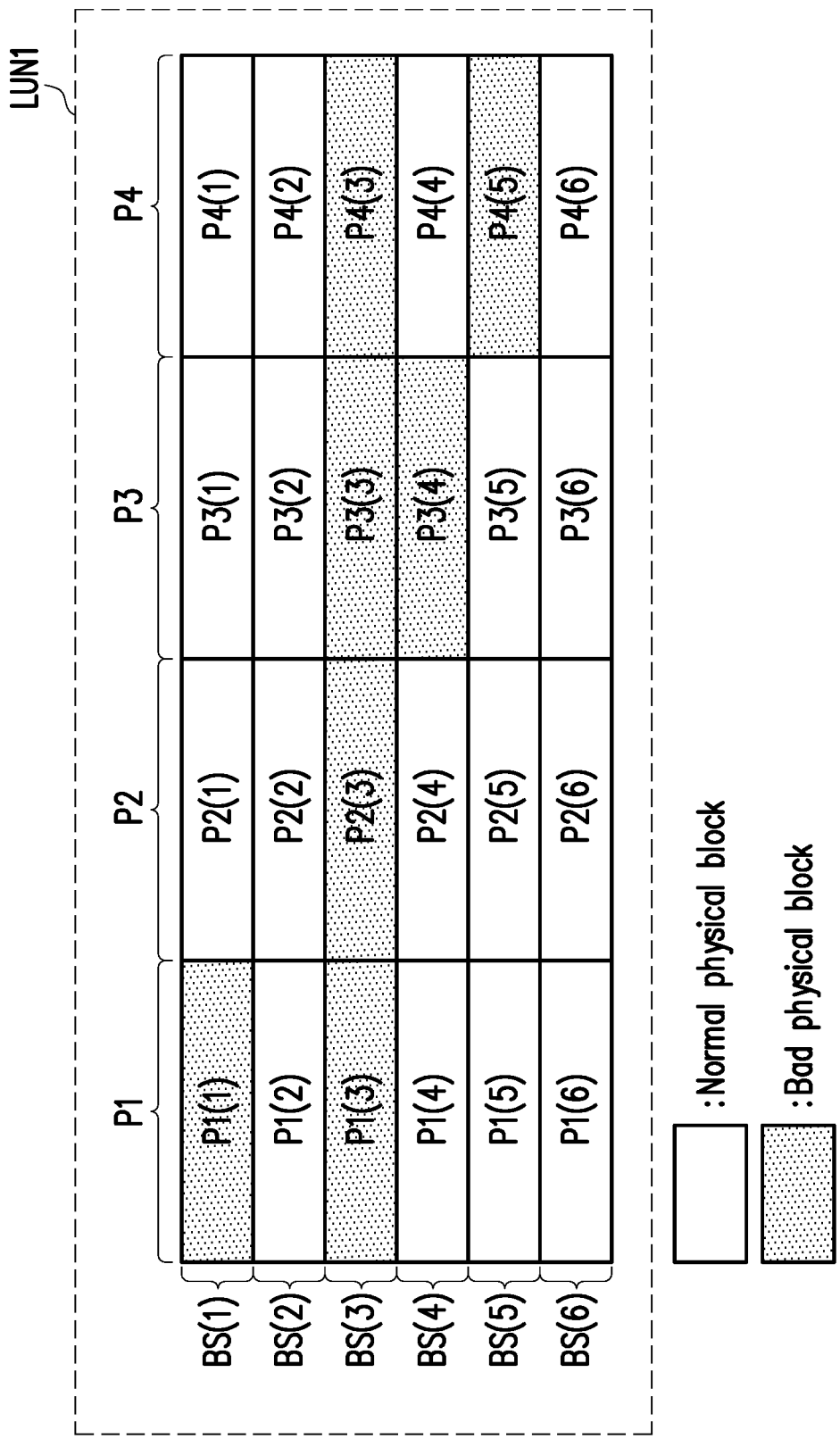
FIG. 4 is a schematic diagram illustrating bad physical blocks according to an embodiment of the invention.

FIG. 4 is a schematic diagram illustrating bad physical blocks according to an embodiment of the invention. For descriptive convenience, it is assumed that M is 6, namely, each of the planes has six physical blocks arranged according to the first sequence, and one logical unit number LUN1 has six block stripes BS(1) to BS(6) in total. In addition, it is assumed that, after performing the bad physical block scanning operation, the bad physical blocks P1(1), P1(3), P2(3), P3(3), P3(4), P4(3) and P4(5) (e.g., gray blocks) are identified by the bad block scanning circuit 2151. With reference to FIG. 4, as described above, the number of the normal physical blocks in the block stripes BS(1), BS(3), BS(4), and BS(5) is less than the number of the normal physical blocks in the block stripes BS(2) and BS(6). In other words, if the processor 211 performs the garbage collection operation on all the block stripes BS(1) to BS(6), the space released from one of the block stripes BS(1), BS(3), BS(4), and BS(5) would be less than the space released from one of the block stripes BS(2) and BS(6). In other words, the effect of performing the garbage collection operation on the block stripe BS(2) and BS(6) would be greater than the effect of performing the garbage collection operation on the block stripes BS(1), BS(3), BS(4), and BS(5).

Referring back to FIG. 2, in step S23, the processor 211 identifies a plurality of valid data counts corresponding to the block stripes. The valid data count of each block stripe is a quotient obtained by dividing a total (a total size) of all the valid data stored in that block stripe by a preset unit size. In this embodiment, the preset unit size is set as the size of one physical page (i.e., the preset unit is one physical page), but the invention is not limited thereto. For example, in other embodiments, the preset unit size may be set as the size of two or more physical pages. As another example, in other embodiments, the preset unit may be other unit sizes (e.g., the preset unit size may be set as the size of one or more codewords, one or more word lines, a plurality of sectors, or one physical block).

Specifically, the processor 211 or the block stripe management circuit unit 215 records the valid data count of each of the block stripes. For example, each time when data stored by one block stripe is updated by one newly stored write data, the processor 211 or the block stripe management circuit unit 215 identifies a size of the updated data, obtains a quotient by dividing that size by a preset unit size, subtracts that quotient from the valid data count of the current one block stripe, so as to reflect the fact that the number of the valid data stored by that stored by this virtual block stripe is reduced. It should be noted that, for descriptive convenience, "one physical page" is used as the preset unit size in the following examples.

For instance, for descriptive convenience, it is assumed that each physical block has six physical pages, each logical block has six logical pages, and a size of the logical page is equal to that of the physical page. Further, it is also assumed that all the physical blocks of the block stripe BS(2) are fully written by the valid data, and the valid data count of the block stripe BS(2) is 24 (the quotient obtained by dividing the valid data with the size of the 24 physical pages by the size of one physical page is 24). According to the current valid data count "24" of the block stripe BS(2), the processor 211 can known that a size of the valid data currently stored by the four physical blocks of the block stripe BS(2) (with 24 physical pages in total) is a size of 24 physical pages in total.

In this example, it is assumed that the processor 211 currently intends to write the write data (the new data) with a size of six physical pages into a first logical block. The first logical block is already stored with old data and mapped to the physical block P1(2) (i.e., the old data stored in the first logical block is actually written into the second physical block of the plane P1). The processor 211 writes the new data into one spare physical block (e.g., the physical block P4(6) is the spare physical block and written with the new data), maps the first logical block to the physical block P4(6), and treats the old data of the physical block P1(2) as invalid data, so as complete the writing operation for storing the new data into the first logical block (the data of the first logical block is updated by the new data). Next, the processor 211 identifies the total size of the old data that became the invalid data, calculates for a quotient obtained by dividing the total size of the old data by the preset unit size (e.g., 6/1=6), and subtracts that quotient from the valid data count of the block stripe BS(2). That is, after the writing operation is completed, the valid data count of the block stripe BS(2) would become 18 (24−6=18). According to the current valid data count "18" of the block stripe BS(2), the processor 211 can known that the size of the valid data currently stored by the four physical blocks of the block stripe BS(2) is a size of 18 physical pages.

On the other hand, when one physical block is written with the new valid data, the valid data count of the block stripe of that physical block is increased in response to the size of the new valid data.

Continuing with the above example, it is assumed that before the new data is written, only the physical block P4(6) is empty in the block stripe BS(6). That is to say, the physical block P4(6) is the spare physical block. In addition, it is assumed that the valid data count of the block stripe BS(6) is 18. In this case, the processor 211 can known that each of three physical blocks P1(6), P2(6) and P3(6) is fully written by the valid data with the size of six physical pages (18/3=6). After the writing operation for the new data is completed, the physical block P4(6) is fully written by the new data, and the processor 211 or the block stripe management circuit unit 215 adds 6 to the valid data count of the block stripe BS(6). That is to say, the new valid data count of the block stripe BS(6) is 24.

In this embodiment, when all the physical units in one block stripe are stored with the data, the processor 211 or the block stripe management circuit unit 215 records the valid data count of said one block stripe.

Referring back to FIG. 2, in step S25, the block stripe management circuit unit 215 is configured to calculate a plurality of effective weight values corresponding to the block stripes according to a plurality of data accessing time parameters of the rewritable non-volatile memory module, the valid data counts, and a location of the identified one or more bad physical blocks.

In this embodiment, the data accessing time parameters include a writing unit time, a reading unit time, a block stripe erasing time and a system operation time. The writing unit time is configured to indicate a time spent on completing a writing operation for writing data of the preset unit size into the rewritable non-volatile memory module. The reading unit time is configured to indicate a time spent on completing a reading operation for reading the data of the preset unit size from the rewritable non-volatile memory module. The block stripe erasing time is configured to indicate a time spent on completing all erasing operations performed on all normal physical blocks of one block stripe of the rewritable non-volatile memory module, wherein one of the physical blocks has one or more preset unit sizes. The system operation time is configured to indicate a time spent on completing a plurality of system operations performed on one block stripe. The system operations include: (1) reading a physical to logical address mapping table corresponding to an i-th block stripe, and (2) identifying physical addresses of all the valid data of the i-th block stripe.

More specifically, in a first embodiment, in the operation where the block stripe management circuit unit 215 is configured to calculate the effective weight values corresponding to the block stripes according to the data accessing time parameters of the rewritable non-volatile memory module, the valid data counts, and the location of the identified one or more bad physical blocks (assuming that it is currently calculating the effective weight value of a first block stripe among the block stripes), the block stripe management circuit unit 215 (e.g., the effective weight calculating circuit 2152) identifies one or more normal physical blocks existing in the first block stripe according to the identified one or more bad physical blocks. Next, the block stripe management circuit unit 215 uses a quotient obtained by dividing a size of an available space released by the erasing operation performed on the one or more normal physical blocks of the first block stripe by the preset unit size as a first release amount; and the block stripe management circuit unit 215 calculates a first processing time corresponding to the first block stripe according to the first valid count and the data accessing time parameters, wherein a first effective weight value corresponding to the first block stripe among the effective weight values includes a quotient obtained by dividing the first processing time by the first release amount, wherein that quotient is used as a first time efficiency ratio of the first block stripe. More specifically, the block stripe management circuit unit 215 (e.g., the effective weight calculating circuit 2152) is configured to calculate the effective weight value of the i-th block stripe among the block stripes by using the following equation (F1):

$$TER_i = \frac{(V_i * tR + V_i * tW + tE + tC)}{EP_i} \quad \text{(F1)}$$

In the equation (F1), TERi is used to denote a time efficiency ratio of an i-th block stripe among the block stripes. Vi is used to denote a valid data count of the i-th block stripe. tR is used to denote a time spent on completing a reading operation for reading valid data of the preset unit size from the rewritable non-volatile memory module (a.k.a. the reading unit time). tW is used to denote a time spent on completing a writing operation for writing the valid data of the preset unit size into the rewritable non-volatile memory module (a.k.a. the writing unit time). tE is used to denote a time spent on completing all erasing operations performed on all the no mal physical blocks of the i-th block stripe (a.k.a. the erasing unit time), and tC is used to denote a time spent on completing a plurality of system operations performed on the i-th block stripe. EPi is used to denote a release amount of the i-th block stripe (e.g., the first release amount for the first block stripe). In other words, a processing time of one block stripe (e.g., the first processing time of the first block stripe) is a calculation result of a numerator, i.e., an expression (Vi*tR+Vi*tW+tE+tC), on the right side of the equal sign in the equation (F1) (a denominator on the right side of the equal sign in the equation (F1) is the release amount of that block stripe). In other words, the time efficiency ratio of one block stripe (e.g., the first time efficiency ratio of the first block stripe) is a quotient obtained by dividing the processing time of one block stripe by the release amount of one block stripe.

In the first embodiment, the effective weight value of the i-th block stripe is equal to (set as) the time efficiency ratio of the i-th block stripe (e.g., the first effective weight value of the first block stripe is equal to the first time efficiency ratio). However, the invention is not limited in this regard. The effective weight value of one block stripe may be set as the time efficiency ratio of that block stripe plus a specific value.

For example, in a second embodiment, the effective weight value of the i-th block stripe is equal to (set as) a sum obtained by adding a delay parameter corresponding to the i-th block stripe to the time efficiency ratio of the i-th block stripe (e.g., the first effective weight value of the first block stripe is equal to the first time efficiency ratio plus a first delay parameter corresponding to the first block stripe).

Specifically, after the garbage collection operation performed on one block stripe (e.g., the first block stripe) is completed, the block stripe management circuit unit 215 sets a value of the first delay parameter to a predetermined delay value, and subtracts one from the delay parameters of the rest of the block stripes; and when the garbage collection operation is performed on another block stripe among the block stripes excluding the first block stripe, the block stripe management circuit unit 215 subtracts one from the first delay parameter. The preset delay is a positive integer set based on the manufacturer's demand. In other words, because the mechanism of "the delay parameter" is added to the effective weight value of one block stripe, the effective weight value of the said one block stripe would include the following feature. After the garbage collection operation is completed, the effective weight value would become a greater value, and the effective weight value would be gradually increased according to the number of times the garbage collection operation is performed on the other block stripes.

More specifically, in an embodiment, the block stripe management circuit unit 215 (e.g., the effective weight calculating circuit 2152) is configured to calculate the effective weight value of the i-th block stripe among the block stripes by using the following equation (F2):

$$W_i = R_i + TER_i \tag{F2}$$

In the equation (F1), TERi is used to denote the time efficiency ratio of the i-th block stripe among the block stripes, and its calculation method is similar to that of the equation (F1) in the first embodiment above. Wi is used to denote the effective weight value of the i-th block stripe among the block stripes, and Ri is used to denote the delay parameter of the i-th block stripe.

It should be noted that, the block stripe management circuit unit 215 would correspondingly and instantly update the effective weight value of each block stripe according to data accessing or system operations performed by the storage device 20. The block stripe management circuit unit 215 (e.g., the effective weight calculating circuit 2152) would record the effective weight value. For example, when the valid data count of one block stripe is changed, or when the garbage collection operation is performed on one block stripe, the effective weight value of said one block stripe is changed, and the changed effective weight value is recorded/updated.

Referring back to FIG. 2, after the effective weight value is calculated (updated) for each of the block stripes, the method proceeds to step S27, in which the block stripe management circuit unit 215 selects a target effective weight value from the effective weight values, and performs the garbage collection operation on a target block stripe corresponding to the target effective weight value among the block stripes.

Specifically, in the operation where the block stripe management circuit unit 215 selects the target effective weight value from the effective weight values, the block stripe management circuit unit 215 compares the effective weight values with a garbage collection weight threshold. Next, the block stripe management circuit unit 215 uses the effective weight value less than the garbage collection weight threshold among the effective weight values as the target effective weight value.

In other words, the effective weight value of the target block stripe selected to perform the garbage collection is less than a garbage collection weight threshold. If the target block stripe is plural, according to a size order of the effective weight values of the target block stripes, the target block stripes are arranged in a small to large manner as one garbage collection block stripe sequence, and the garbage collection operation is performed starting with the target block stripe arranged at the first place in the garbage collection block stripe sequence.

In other words, when the processor 211 determines that it is required to perform the garbage collection operation in order to release space, the processor 211 would select the block stripe with the smallest effective weight value according to the created garbage collection block stripe sequence to perform the garbage collection operation.

It should be noted that, the effective weight value obtained using the first embodiment can solve the negative impact caused by the bad physical blocks. For instance, with reference to FIG. 4, it is assumed that the number of the physical pages of each physical block is 256; the block stripe BS(1) and the block stripe BS(2) are both fully written by the valid data; the valid data count is 768 (e.g., 256*3) and the release amount is 768 (256*3) in the block stripe BS(1), and the valid data count is 1024 (e.g., 256*4) and the release amount is 1024 (256*4) in the block stripe BS(1). According to the equation (F1), it can be known that the effective weight value (i.e., the time efficiency ratio) of the block stripe BS(1) would be greater than the effective weight value of the block stripe BS(2) (due to the fact that the denominator "1024" of the time efficiency ratio of the block stripe BS(2) is far greater than the denominator "768" of the time efficiency ratio of the block stripe BS(1)). Therefore, the block stripe BS(2) is more suitable for being selected as the target block stripe to perform the garbage collection operation, as compared to the block stripe BS(1). In other words, with use of the memory management method provided by the foregoing embodiment, the block stripe selected to perform the garbage collection operation would be the block stripe with less bad physical blocks.

On the other, the effective weight value obtained using the second embodiment above can further solve a phenomenon of "the garbage collection operation is frequently performed on the block stripe" caused by the data being updated too frequently. Specifically, as described above, after the garbage collection operation is completed, the effective weight value would become a greater value. Therefore, when the next garbage collection operation is to be performed, the effective weight value of the block stripe on which the garbage collection operation is just completed would not be selected as the target block stripe because a greater delay parameter is newly set, so as prevent the phenomenon of the garbage collection operation is frequently performed on one block stripe. In this way, the negative effect of excessive wearing on one block stripe caused the garbage collection operation being perform on that block may be prevented.

In summary, the memory management method and the storage controller provided by the embodiments of the invention can be used to scan and identify the bad physical blocks, calculate the effective weight values corresponding to the block stripes according to the data accessing time parameters of the rewritable non-volatile memory module, the valid data counts, and the location of the identified one or more bad physical blocks, and select the target block stripe among the block stripes according to the effective weight values to perform the garbage collection operation. As a result, the more appropriate block stripe that can release more space may be selected with the bad physical block taken into consideration to improve efficiency of the garbage collection operation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory management method, adapted to a storage device having a rewritable non-volatile memory module, wherein the rewritable non-volatile memory module has a plurality of physical blocks, wherein the physical blocks are divided into a plurality of block stripes, the block stripes are arranged according to a first sequence, and the memory management method comprises:
    scanning the physical blocks to identify one or more bad physical blocks among the physical blocks;
    identifying a plurality of valid data counts corresponding to the block stripes;
    calculating a plurality of effective weight values corresponding to the block stripes according to a plurality of data accessing time parameters of the rewritable non-volatile memory module, the valid data counts, and a location of the identified one or more bad physical blocks, wherein the data accessing time parameters comprise a plurality of time parameters indicating different time corresponding to different operations performed on the rewritable non-volatile memory module and one block stripe of the rewritable non-volatile memory module; and
    selecting a target effective weight value from the effective weight values, and performing a garbage collection operation on a target block stripe corresponding to the target effective weight value among the block stripes,
    wherein a first valid data count corresponding to a first block stripe of the block stripes among the valid data counts is a quotient obtained by dividing a total of valid data stored by all first physical blocks of the first block stripes by a preset unit size,
    wherein the data accessing time parameters comprise:
    a writing unit time, configured to indicate a time spent on completing a writing operation for writing data of the preset unit size into the rewritable non-volatile memory module;
    a reading unit time, configured to indicate a time spent on completing a reading operation for reading the data of the preset unit size from the rewritable non-volatile memory module;
    a block stripe erasing time, configured to indicate a time spent on completing all erasing operations performed on all normal physical blocks of the one block stripe of the rewritable non-volatile memory module, wherein one of physical blocks has one or more preset unit sizes; and
    a system operation time, configured to indicate a time spent on completing a plurality of system operations performed on the one block stripe.

2. The memory management method according to claim 1, wherein the step of selecting the target effective weight value from the effective weight values comprises:
    comparing the effective weight values with a garbage collection weight threshold; and
    using the effective weight value less than the garbage collection weight threshold among the effective weight values as the target effective weight value.

3. The memory management method according to claim 1, wherein the step of calculating the effective weight values corresponding to the block stripes according to the data accessing time parameters of the rewritable non-volatile memory module, the valid data count, and the location of the identified one or more bad physical blocks comprises:
    identifying one or more normal physical blocks existing in the first block stripe according to the identified one or more bad physical blocks, wherein the one or more normal physical blocks are different from the one or more bad physical blocks;
    using a quotient obtained by dividing a size of an available space released by the erasing operation performed on the one or more normal physical blocks of the first block stripe by the preset unit size as a first release amount; and
    calculating a first processing time corresponding to the first block stripe according to the first valid count and the data accessing time parameters, wherein a first effective weight value corresponding to the first block stripe among the effective weight values comprises a quotient obtained by dividing the first processing time by the first release amount, wherein the quotient obtained by dividing the first processing time by the first release amount is used as a first time efficiency ratio of the first block stripe.

4. The memory management method according to claim 3, wherein the effective weight value of each of the block stripes is calculated by a first equation:

$$TER_i = \frac{(V_i * tR + V_i * tW + tE + tC)}{EP_i}$$

wherein $TER_i$ is used to denote a time efficiency ratio of an i-th block stripe among the block stripes, $V_i$ is used to denote a valid data count of the i-th block stripe, $tR$ is used to denote a time spent on completing a reading operation for reading valid data of the preset unit size from the rewritable non-volatile memory module, $tW$ is used to denote a time spent on completing a writing operation for writing the valid data of the preset unit size into the rewritable non-volatile memory module, $tE$ is used to denote a time spent on completing all erasing operations performed on all the normal physical blocks of the i-th block stripe, $tC$ is used to denote a time spent on completing a plurality of system operations performed on the i-th block stripe, and $EP_i$ is used to denote a release amount of the i-th block stripe, wherein the system operations comprise (1) reading a physical to logical address mapping table corresponding to the i-th block stripe, and (2) identifying physical addresses of all the valid data of the i-th block stripe, wherein the first processing time is obtained by calculating a numerator of the first equation, and the first release amount is obtained by calculating a denominator of the first equation, wherein the effective weight value of the i-th block stripe is equal to the time efficiency ratio.

5. The memory management method according to claim 3, wherein the first effective weight value corresponding to the first block stripe among the effective weight values is a sum obtained by adding a first delay parameter to the quotient obtained by dividing the first processing time by the first release amount, and the memory management method further comprises:
  after the garbage collection operation performed on the first block stripe is completed, setting a value of the first delay parameter to a predetermined delay value, and subtracting one from delay parameters of the rest of the block stripes; and
  when the garbage collection operation is performed on another block stripe among the block stripes excluding the first block stripe, subtracting one from the first delay parameter.

6. The memory management method according to claim 5, wherein the effective weight value of each of the block stripes is calculated by a second equation:

$$W_i = R_i + TER_i$$

wherein Wi is used to denote an effective weight value of the i-th block stripe among the block stripes, and Ri is used to denote a delay parameter of the i-th block stripe.

7. A storage controller, configured to control a storage device having a rewritable non-volatile memory module, the storage controller comprising:
  a connection interface circuit, configured to couple to a host system;
  a memory interface control circuit, configured to couple to the rewritable non-volatile memory module, wherein the rewritable non-volatile memory module has a plurality of physical blocks, wherein the physical blocks are divided into a plurality of block stripes, and the block stripes are arranged according to a first sequence;
  a block stripe management circuit unit; and
  a processor, coupled to the connection interface circuit, the memory interface control circuit and the block stripe management circuit unit,
  wherein the block stripe management circuit unit is configured to scan the physical blocks to identify one or more bad physical blocks among the physical blocks,
  wherein the block stripe management circuit unit is further configured to identify a plurality of valid data counts corresponding to the block stripes,
  the block stripe management circuit unit is further configured to calculate a plurality of effective weight values corresponding to the block stripes according to a plurality of data accessing time parameters of the rewritable non-volatile memory module, the valid data counts, and a location of the identified one of more bad physical blocks, wherein the data accessing time parameters comprise a plurality of time parameters indicating different time corresponding to different operations performed on the rewritable non-volatile memory module and one block stripe of the rewritable non-volatile memory module,
  wherein the block stripe management circuit unit is further configured to select a target effective weight value from the effective weight values, and perform a garbage collection operation on a target block stripe corresponding to the target effective weight value among the block stripes,
  wherein a first valid data count corresponding to a first block stripe of the block stripes among the valid data counts is a quotient obtained by dividing a total of valid data stored by all first physical blocks of the first block stripes by a preset unit size,
  wherein the data accessing time parameters comprise:
  a writing unit time, configured to indicate a time spent on completing a writing operation for writing data of the preset unit size into the rewritable non-volatile memory module;
  a reading unit time, configured to indicate a time spent on completing a reading operation for reading the data of the preset unit size from the rewritable non-volatile memory module;
  a block stripe erasing time, configured to indicate a time spent on completing all erasing operations performed on all normal physical blocks of the one block stripe of the rewritable non-volatile memory module, wherein one of the physical blocks has one or more preset unit sizes; and
  a system operation time, configured to indicate a time spent on completing a plurality of system operations performed on the one block stripe.

8. The storage controller according to claim 7, wherein in the operation where the block stripe management circuit unit is further configured to select the target effective weight value from the effective weight values,
  the block stripe management circuit unit compares the effective weight values with a garbage collection weight threshold; and
  the block stripe management circuit unit uses the effective weight value less than the garbage collection weight threshold among the effective weight values as the target effective weight value.

9. The storage controller according to claim 7, wherein in the operation where the block stripe management circuit unit is further configured to calculate the effective weight values corresponding to the block stripes according to the data accessing time parameters of the rewritable non-volatile memory module, the valid data counts, and the location of the identified one or more bad physical blocks,
  the block stripe management circuit unit is further configured to identify one or more normal physical blocks existing in the first block stripe according to the identified one or more bad physical blocks, wherein the one or more normal physical blocks are different from the one or more bad physical blocks;
  the block stripe management circuit unit uses a quotient obtained by dividing a size of an available space released by the erasing operation performed on the one or more normal physical blocks of the first block stripe by the preset unit size as a first release amount; and
  the block stripe management circuit unit calculates a first processing time corresponding to the first block stripe according to the first valid count and the data accessing time parameters, wherein a first effective weight value corresponding to the first block stripe among the effective weight values comprises a quotient obtained by dividing the first processing time by the first release amount, wherein the quotient obtained by dividing the first processing time by the first release amount is used as a first time efficiency ratio of the first block stripe.

10. The storage controller according to claim 9, wherein the block stripe management circuit unit is configured to calculate the effective weight value of each of the block stripes by using a first equation:

$$TER_i = \frac{(V_i * tR + V_i * tW + tE + tC)}{EP_i}$$

wherein TERi is used to denote a time efficiency ratio of an i-th block stripe among the block stripes, Vi is used to denote a valid data count of the i-th block stripe, tR is used to denote a time spent on completing a reading operation for reading valid data of the preset unit size from the rewritable non-volatile memory module, tW is used to denote a time spent on completing a writing operation for writing the valid data of the preset unit size into the rewritable non-volatile memory module, tE is used to denote a time spent on completing all erasing operations performed on all the normal physical blocks of the i-th block stripe, tC is used to denote a time spent on completing a plurality of system operations performed on the i-th block stripe, and EPi is used to denote a release amount of the i-th block stripe, wherein the system operations comprise (1) reading a physical to logical mapping table corresponding to the i-th block stripe, and (2) identifying physical addresses of all the valid data of the i-th block stripe, wherein the first processing time is obtained by calculating a numerator of the first equation, and the first release amount is obtained by calculating a denominator of the first equation, wherein the effective weight value of the i-th block stripe is equal to the time efficiency ratio.

11. The storage controller according to claim 9, wherein the first effective weight value corresponding to the first block stripe among the effective weight values is a sum obtained by adding a first delay parameter to the quotient obtained by dividing the first processing time by the first release amount, wherein after the garbage collection operation performed on the first block stripe is completed, the block stripe management circuit unit sets a value of the first delay parameter to a predetermined delay value, and subtracts one from delay parameters of the rest of the block stripes; and when the garbage collection operation is performed on another block stripe among the block stripes excluding the first block stripe, the block stripe management circuit unit subtracts one from the first delay parameter.

12. The storage controller according to claim 11, wherein the block stripe management circuit unit is configured to calculate the effective weight value of each of the block stripes by using a second equation:

$$W_i = R_i + TER_i$$

wherein Wi is used to denote an effective weight value of the i-th block stripe among the block stripes, and Ri is used to denote a delay parameter of the i-th block stripe.

* * * * *